(12) United States Patent
Dobashi et al.

(10) Patent No.: US 12,171,068 B2
(45) Date of Patent: Dec. 17, 2024

(54) ELECTRONIC DEVICE AND METHOD FOR MANUFACTURING ELECTRONIC DEVICE

(71) Applicant: PANASONIC INTELLECTUAL PROPERTY MANAGEMENT CO., LTD., Osaka (JP)

(72) Inventors: Koji Dobashi, Kanagawa (JP); Koichi Sasaki, Kanagawa (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 0 days.

(21) Appl. No.: 18/106,716

(22) Filed: Feb. 7, 2023

(65) Prior Publication Data

US 2023/0254982 A1    Aug. 10, 2023

(30) Foreign Application Priority Data

Feb. 9, 2022    (JP) .................................. 2022-018736

(51) Int. Cl.
| | |
|---|---|
| *H05K 5/00* | (2006.01) |
| *H05K 3/32* | (2006.01) |
| *H05K 5/03* | (2006.01) |

(52) U.S. Cl.
CPC ........... *H05K 3/328* (2013.01); *H05K 5/0039* (2013.01); *H05K 5/03* (2013.01); *H05K 2203/107* (2013.01)

(58) Field of Classification Search
CPC ......... H05K 5/03; H05K 5/0039; H05K 5/328
(Continued)

(56) References Cited

U.S. PATENT DOCUMENTS

| | | | | |
|---|---|---|---|---|
| 2004/0084140 | A1 | 5/2004 | Kobayashi | |
| 2005/0218123 | A1* | 10/2005 | Hayakawa | ........ B29C 66/53461 219/121.64 |

(Continued)

FOREIGN PATENT DOCUMENTS

| | | | | |
|---|---|---|---|---|
| JP | 2000-174468 | | 6/2000 | |
| JP | 2004063331 | A * | 2/2004 | ......... B29C 65/1635 |

(Continued)

OTHER PUBLICATIONS

Japan Office Action issued in Japan Patent Application No. 2022-18736, dated Dec. 5, 2023, together with English translation thereof.
(Continued)

*Primary Examiner* — Hung S. Bui
(74) *Attorney, Agent, or Firm* — Greenblum & Bernstein, P.L.C.

(57) ABSTRACT

An electronic device includes a housing formed of a resin member having a predetermined light absorption property and having an opening, a circuit board accommodated in the housing and on which an electronic circuit is formed, at least one terminal including one end portion and the other end portion electrically connected to the circuit board, and a cover portion covering the opening of the housing, penetrating the at least one terminal, and formed of a resin member having a predetermined light transmitting property. The one end portion of the at least one terminal is located opposite to the other end portion with reference to the cover portion, and the cover portion is molded at a mold temperature of 100 degrees to 180 degrees. The at least one terminal and the circuit board are electrically connected by solder joining. The housing and the cover portion are connected by laser welding.

20 Claims, 3 Drawing Sheets

(58) Field of Classification Search
USPC .................................. 361/753, 728, 796, 800
See application file for complete search history.

(56) References Cited

U.S. PATENT DOCUMENTS

| | | | |
|---|---|---|---|
| 2016/0052202 A1 | 2/2016 | Nishikawa et al. | |
| 2017/0259468 A1 | 9/2017 | Nishikawa et al. | |
| 2018/0020558 A1* | 1/2018 | Saito .................... | H05K 5/0082 |
| 2023/0224565 A1 | 7/2023 | Tanaka | |

FOREIGN PATENT DOCUMENTS

| | | | |
|---|---|---|---|
| JP | 2005-537160 | 12/2005 | |
| JP | 2006-165351 | 6/2006 | |
| JP | 2010-258360 | 11/2010 | |
| JP | 2016-046243 | 4/2016 | |
| JP | 2016-117225 | 6/2016 | |
| JP | 2016-150547 | 8/2016 | |
| JP | 2017-115093 | 6/2017 | |
| JP | 2021-048334 | 3/2021 | |
| WO | WO-2020235464 A1 * | 11/2020 | ......... B60R 16/0238 |
| WO | 2021/200557 | 10/2021 | |

OTHER PUBLICATIONS

Japan Office Action issued in Japan Patent Application No. 2022-18736, dated Mar. 5, 2024, together with English translation thereof.

\* cited by examiner

ELECTRONIC DEVICE AND METHOD FOR MANUFACTURING ELECTRONIC DEVICE

CROSS-REFERENCE TO RELATED APPLICATIONS

This application is based on and claims priority under 35 USC 119 from Japanese Patent Application No. 2022-018736 filed on Feb. 9, 2022, the contents of which are incorporated herein by reference.

TECHNICAL FIELD

The present disclosure relates to an electronic device and a method for manufacturing an electronic device.

BACKGROUND ART

A technique for attaching a case main body and a lid portion by laser welding is known. For example, Patent Literature 1 discloses the following configuration. That is, a case main body is formed of a material having a light absorption property, includes a joint portion on an upper surface of the case main body, and is integrally provided with a guide wall portion located inside of the case main body to prevent positional deviation. On the other hand, the lid portion is formed of a material having a light transmitting property, includes an upper wall portion as an infrared transmission window, and includes a joining flange portion on an outer circumference of a lower portion of the lid portion. When the lid portion is laser-welded to the case main body, the flange portion of the lid portion butts and overlaps the joint portion of the case main body, and is pressed by a pressing jig. At this time, the flange portion of the lid portion is positioned by the guide wall portion. Then, in a butted state, laser light is emitted to an upper surface of the joint portion through the flange portion by a laser welding device. Accordingly, the joint portion of the case main body is heated and melted by the laser light, and is welded to a lower surface portion of the flange portion.

CITATION LIST

Patent Literature

Patent Literature 1: JP2016-117225A

SUMMARY OF INVENTION

In order to prevent a variation in joining strength in the laser welding, it is required that the light transmitting property of a member through which the laser light is transmitted is uniform.

An object of the present disclosure is to provide an electronic device in which a laser light-transmitting member has a uniform light transmitting property in laser welding, and a method for manufacturing the electronic device.

The present disclosure is to provide an electronic device including a housing that is formed of a resin member having a predetermined light absorption property and that has an opening, a circuit board that is accommodated in the housing and on which an electronic circuit is formed, at least one terminal that includes one end portion and the other end portion, the other end portion being electrically connected to the circuit board, and a cover portion that covers the opening of the housing, that penetrates the at least one terminal, and that is formed of a resin member having a predetermined light transmitting property. The one end portion of the at least one terminal is located opposite to the other end portion with reference to the cover portion. The cover portion is molded at a mold temperature of 100 degrees to 180 degrees. The at least one terminal and the circuit board are electrically connected to each other by solder joining. The housing and the cover portion are connected to each other by laser welding.

Further, the present disclosure is to provide a method for manufacturing an electronic device. The method includes performing solder joining on a circuit board and at least one terminal of a cover portion molded at a mold temperature of 100 degrees to 180 degrees using a resin member having a predetermined light transmitting property, accommodating the circuit board in a housing formed of a member having a laser light absorption property, and joining the cover portion to the housing by laser welding.

According to the present disclosure, it is possible to provide an electronic device in which a laser light-transmitting member has a uniform light transmitting property in laser welding, and a method for manufacturing the electronic device.

DESCRIPTION OF EMBODIMENTS

Hereinafter, embodiments of the present disclosure will be described in detail with reference to the drawings as appropriate. However, the unnecessarily detailed description may be omitted. For example, the detailed description of already well-known matters and the repeated description of substantially the same configuration may be omitted. This is to avoid unnecessary redundancy of the following description and to facilitate understanding of those skilled in the art. The accompanying drawings and the following description are provided for those skilled in the art to fully understand the present disclosure, and are not intended to limit the subject matter described in the claims.

Embodiment

Figure 1:
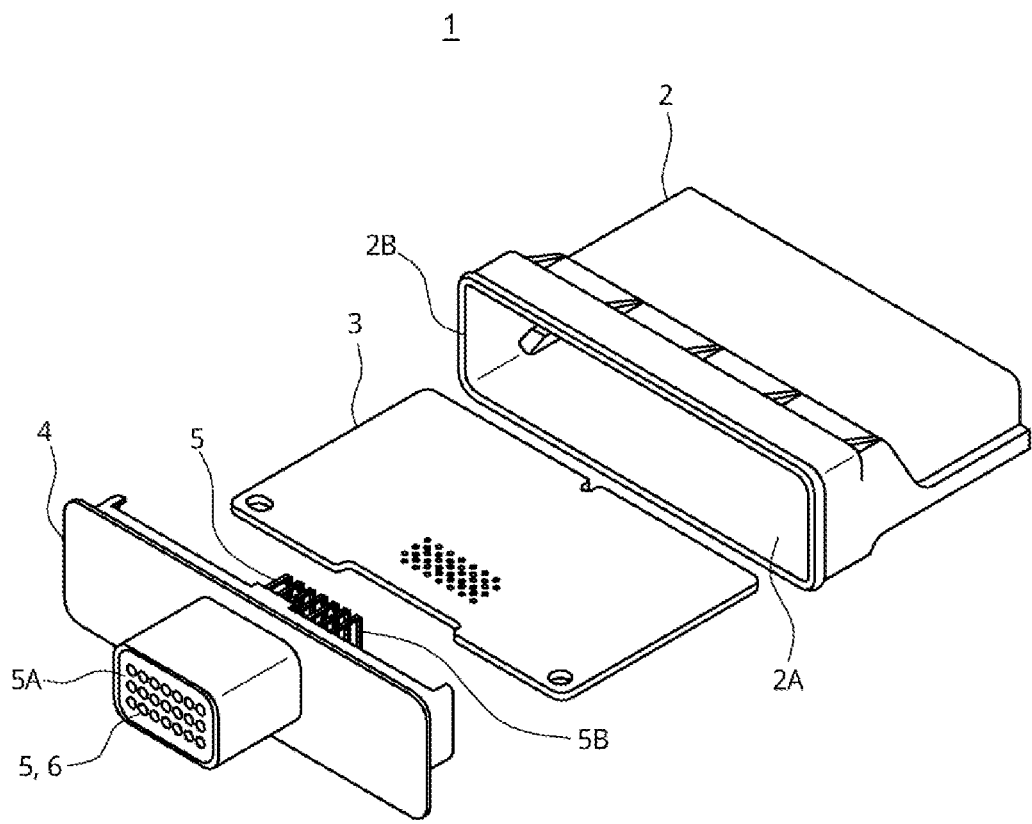
FIG. 1 is an exploded perspective view showing a configuration of an electronic device according to an embodiment.
Figure 1:
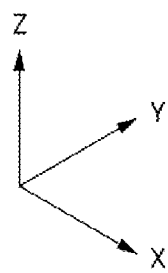
Figure 2:
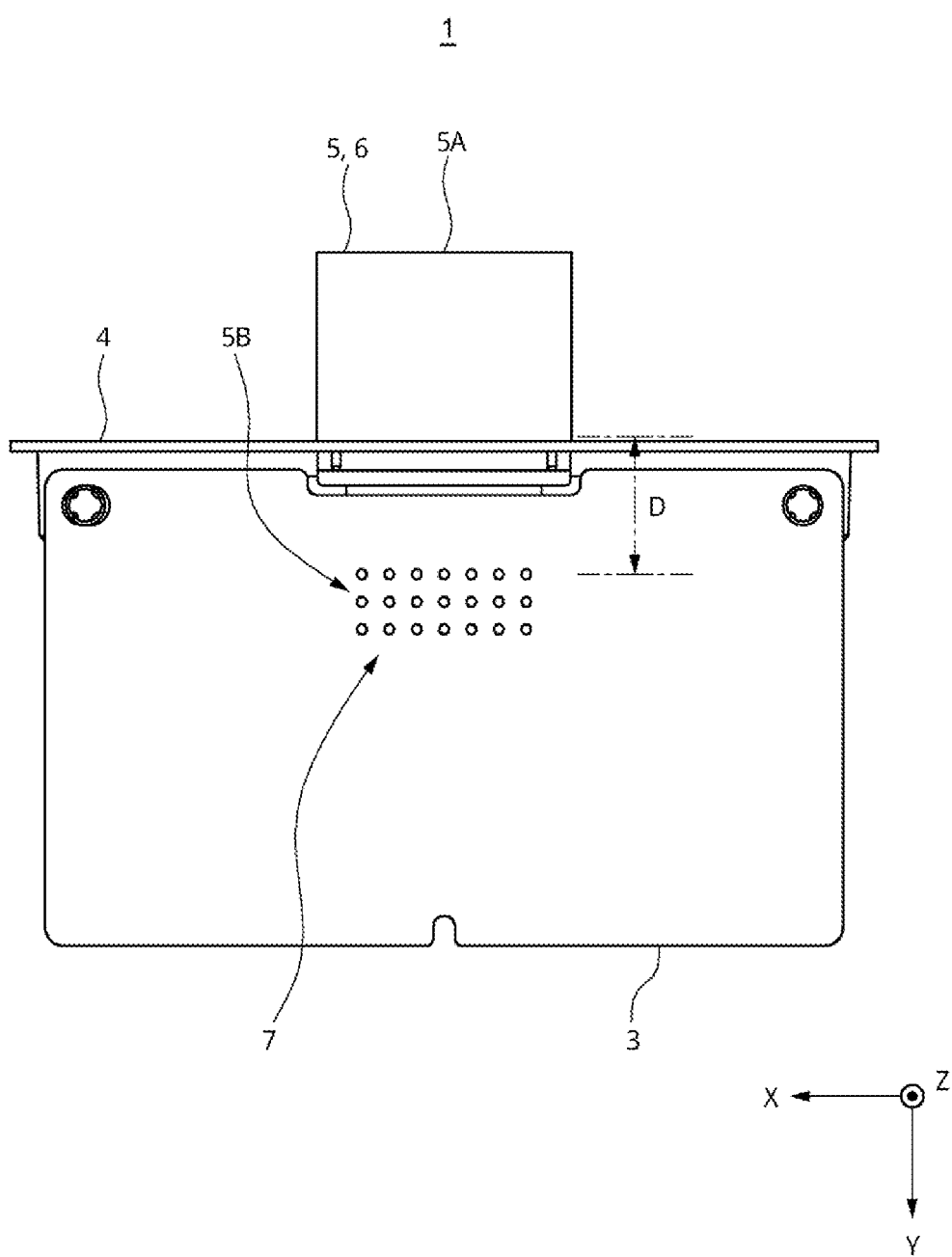
FIG. 2 is a plan view showing a state in which a terminal and a circuit board are subjected to solder joining in a cover portion according to the present embodiment.
Figure 3:
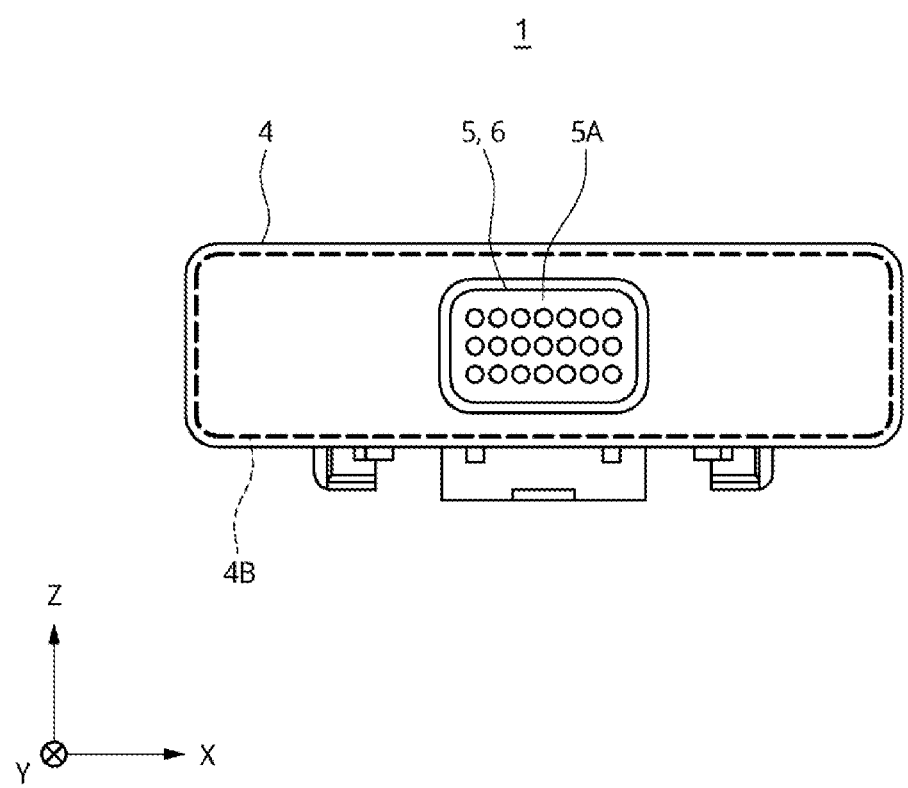
FIG. 3 is a front view showing a portion of laser welding in the cover portion according to the present embodiment.

FIG. 1 is an exploded perspective view showing a configuration of an electronic device 1 according to an embodiment. FIG. 2 is a plan view showing a state in which a terminal 5 and a circuit board 3 are subjected to solder joining 7 in a cover portion 4 according to the present embodiment. FIG. 3 is a front view showing a portion of laser welding in the cover portion 4 according to the present embodiment.

For convenience of description, as shown in FIG. 1, an axis extending perpendicular to a main surface of the circuit board 3 is defined as a Z axis. An axis perpendicular to the Z axis and extending perpendicular to the main surface of the cover portion 4 is defined as a Y axis. An axis perpendicular to the Y axis and the Z axis is defined as an X axis. For convenience of description, a positive direction of the Z axis may be referred to as "upper", a negative direction of the Z axis may be referred to as "lower", a negative direction of the Y axis may be referred to as "front", a positive direction of the Y axis may be referred to as "rear", a positive direction of the X axis may be referred to as "right", and a negative direction of the X axis may be referred to as "left". Expressions related to these directions are used for convenience of description, and are not intended to limit a posture during actual use of this structure.

The electronic device 1 is mounted on a vehicle. Examples of the vehicle on which the electronic device 1 is mounted include a motorcycle, an automobile, and an electrically assisted bicycle.

The electronic device 1 includes a housing 2, the circuit board 3, the cover portion 4, and at least one terminal 5.

The housing 2 has a hollow rectangular parallelepiped shape and has the opening 2A on one surface thereof. However, the shape of the housing 2 is not limited to a rectangular parallelepiped, and may be any shape as long as the circuit board 3 can be accommodated in the housing 2. The housing 2 is formed of a resin member having a predetermined light absorption property.

The circuit board 3 is formed with an electronic circuit (not shown), and is accommodated inside the housing 2 from the opening 2A of the housing 2. The circuit board 3 is used to control a vehicle on which the electronic device 1 is mounted. Therefore, the circuit board 3 may be read as an electronic control unit (ECU), and the housing 2 may be read as an ECU case.

The cover portion 4 covers the opening 2A of the housing 2. At least one terminal 5 penetrates the cover portion 4.

As shown in FIG. 2, the at least one terminal 5 includes one end portion 5A and the other end portion 5B, the one end portion 5A is located opposite to the other end portion 5B with reference to the cover portion 4, and the other end portion 5B is electrically connected to the circuit board 3. The at least one terminal 5 may be formed integrally with the cover portion 4. Alternatively, the at least one terminal 5 and the cover portion 4 may be separate. The at least one terminal 5 may be a part of a connector 6. A part of the at least one terminal 5 may be curved. The at least one terminal 5 may penetrate the circuit board 3.

As shown in FIG. 2, the at least one terminal 5 and the circuit board 3 are electrically connected by the solder joining 7.

A light absorption property (light absorptance) of the housing 2 is higher than a light absorption property (light absorptance) of the cover portion 4. A light transmitting property (light transmittance) of the cover portion 4 is higher than a light transmitting property (light transmittance) of the housing 2. Then, as shown in FIG. 3, the laser light is emitted to a portion (that is, an outer peripheral portion 4B (see FIG. 3) of a main surface on a side exposed to the outside of the cover portion 4) of the cover portion 4 facing an edge portion 2B (see FIG. 1) forming the opening 2A of the housing 2. Since the cover portion 4 has a higher light transmitting property than the housing 2, the emitted laser light passes through the cover portion 4, and heats and melts the edge portion 2B of the housing 2. Accordingly, the cover portion 4 is joined to the edge portion 2B of the housing 2 and closes the opening 2A. In this way, the cover portion 4 is joined to the housing 2 by laser welding.

The cover portion 4 and the housing 2 are formed of, for example, polybutylene terephthalate (PBT). Alternatively; the cover portion 4 and the housing 2 may be formed of a material different from PBT.

A distance D (see FIG. 3) from a portion where the cover portion 4 and the housing 2 are joined to a portion where the at least one terminal 5 and the circuit board 3 are subjected to the solder joining 7 is less than a predetermined distance. That is, a position of the solder joining 7 and the outer peripheral portion 4B irradiated with the laser light in the cover portion 4 are relatively close to each other. Therefore, when the solder joining 7 is performed, the cover portion 4 is exposed to a relatively high temperature (for example, 230 degrees) for melting solder. In the related art, the cover portion 4 that transmits laser light is molded at a relatively low mold temperature such as 40 degrees to 50 degrees in order to prevent crystallization. In this way, when the cover portion 4 molded at a relatively low mold temperature is exposed to a relatively high temperature due to the solder joining 7, a portion exposed to the relatively high temperature is recrystallized and the light transmittance is reduced. For example, in the cover portion 4 molded at a mold temperature of approximately 40 degrees, the light transmittance before the solder joining 7 is performed is approximately 70%, and the light transmittance after the solder joining 7 is performed is reduced to approximately 50% to 60%. Therefore, the light transmittance of the laser light in the cover portion 4 is uneven, and a joining strength between the cover portion 4 and the housing 2 by laser welding varies. The variation in joining strength leads to deterioration in waterproof performance of the circuit board 3 in the housing 2 and deterioration in resistance of the electronic device 1 to vibration of the vehicle.

Therefore, in the present embodiment, the cover portion 4 is molded at a mold temperature between 100 degrees and 180 degrees. Preferably, the cover portion 4 is molded at a mold temperature between 100 degrees and 120 degrees. Accordingly, even if the cover portion 4 is exposed to a relatively high temperature when the solder joining 7 is performed, the light transmittance hardly decreases. For example, in the cover portion 4 molded at a mold temperature of approximately 120 degrees, the light transmittance before the solder joining 7 is performed is approximately 40%, and the light transmittance after the solder joining 7 is performed is approximately 37% to 40%. That is, the light transmittance of the cover portion 4 according to the present embodiment hardly decreases before the solder joining 7 is performed and after the solder joining 7 is performed. Therefore, the light transmittance of the laser light in the cover portion 4 is not uneven (that is, since the light transmittance is uniform), the joining strength between the cover portion 4 and the housing 2 by laser welding does not vary.

A laser oscillator used for laser welding may be a fiber laser (Yb). A wavelength of the laser light may be 1070 nm. A maximum laser output of the laser oscillator may be 100 W. However, in the present embodiment, a type of the laser oscillator, the wavelength of the laser light, and the maximum laser output are not limited thereto.

<Method for Manufacturing Electronic Device>

The electronic device 1 according to the present embodiment may be manufactured by the following steps.

(Step 1) Using a resin member having a predetermined light transmitting property, the cover portion 4 is molded at a mold temperature of 100 degrees and 180 degrees (preferably 100 degrees to 120 degrees).

(Step 2) The other end portion 5B of the at least one terminal 5 formed integrally with the cover portion 4 and the circuit board 3 are subjected to the solder joining 7. The solder joining 7 of the at least one terminal 5 and the circuit board 3 may be performed using at least one of a partial dip, a dip tank, or a reflow oven.

(Step 3) The circuit board 3 is accommodated while being slid inside the housing 2, and the cover portion 4 covers the opening 2A of the housing 2.

(Step 4) The laser light is emitted toward the outer peripheral portion 4B of the cover portion 4, and the cover portion 4 is joined to the housing 2 by laser welding.

Through the above steps, the cover portion 4 and the housing 2 can be laser-welded at a stable joining strength. Therefore, it is possible to manufacture the electronic device 1 having high waterproof performance and high resistance to vibration of the vehicle.

Although the embodiment has been described above with reference to the accompanying drawings, the present disclosure is not limited to such an example. It is apparent to those skilled in the art that various modifications, corrections, substitutions, additions, deletions, and equivalents can be conceived within the scope described in the claims, and it is understood that such modifications, corrections, substitutions, additions, deletions, and equivalents also fall within the technical scope of the present disclosure. The components in the embodiment described above may be freely combined without departing from the gist of the invention.

INDUSTRIAL APPLICABILITY

The technique according to the present disclosure is useful for laser welding.

What is claimed is:

1. An electronic device comprising:
a housing that is formed of a resin member having a predetermined light absorption property and that has an opening;
a circuit board that is accommodated in the housing and on which an electronic circuit is formed;
at least one terminal that includes one end portion and the other end portion, the other end portion being electrically connected to the circuit board; and
a cover portion that covers the opening of the housing, that is penetrated by the at least one terminal, and that is formed of a resin member having a predetermined light transmitting property,
wherein the one end portion of the at least one terminal is located opposite to the other end portion with reference to the cover portion,
wherein the cover portion is molded at a mold temperature of 100 degrees Celsius to 180 degrees Celsius,
wherein the at least one terminal and the circuit board are electrically connected to each other by solder joining,
wherein the housing and the cover portion are connected to each other by laser welding, and
wherein a light absorption property of the housing is higher than a light absorption property of the cover portion.

2. The electronic device according to claim 1,
wherein the at least one terminal is molded integrally with the cover portion.

3. The electronic device according to claim 1,
wherein the at least one terminal is a part of a connector.

4. The electronic device according to claim 1,
wherein a part of the at least one terminal is curved.

5. The electronic device according to claim 1,
wherein the at least one terminal penetrates the circuit board.

6. The electronic device according to claim 1,
wherein the solder joining of the at least one terminal and the circuit board is performed using at least one of a partial dip, a dip tank, or a reflow oven.

7. The electronic device according to claim 1,
wherein the cover portion is molded at a mold temperature of 100 degrees Celsius to 120 degrees Celsius.

8. The electronic device according to claim 1,
wherein a distance from a portion where the cover portion and the housing are joined to a portion where the at least one terminal and the circuit board are subjected to solder joining is less than a predetermined distance.

9. The electronic device according to claim 1,
wherein the cover portion and the housing are formed of polybutylene terephthalate.

10. The electronic device according to claim 1,
wherein the housing has a rectangular parallelepiped shape having an opening.

11. An electronic device comprising:
a housing that is formed of a resin member having a predetermined light absorption property and that has an opening;
a circuit board that is accommodated in the housing and on which an electronic circuit is formed;
at least one terminal that includes one end portion and the other end portion, the other end portion being electrically connected to the circuit board; and
a cover portion that covers the opening of the housing, that is penetrated by the at least one terminal, and that is formed of a resin member having a predetermined light transmitting property,
wherein the one end portion of the at least one terminal is located opposite to the other end portion with reference to the cover portion,
wherein the cover portion is molded at a mold temperature of 100 degrees Celsius to 180 degrees Celsius,
wherein the at least one terminal and the circuit board are electrically connected to each other by solder joining,
wherein the housing and the cover portion are connected to each other by laser welding, and
wherein a light transmitting property of the cover portion is higher than a light transmitting property of the housing.

12. The electronic device according to claim 11,
wherein the at least one terminal is molded integrally with the cover portion.

13. The electronic device according to claim 11,
wherein the at least one terminal is a part of a connector.

14. The electronic device according to claim 11,
wherein a part of the at least one terminal is curved.

15. The electronic device according to claim 11,
wherein the at least one terminal penetrates the circuit board.

16. The electronic device according to claim 11,
wherein the solder joining of the at least one terminal and the circuit board is performed using at least one of a partial dip, a dip tank, or a reflow oven.

17. The electronic device according to claim 11,
wherein the cover portion is molded at a mold temperature of 100 degrees Celsius to 120 degrees Celsius.

18. The electronic device according to claim 11,
wherein a distance from a portion where the cover portion and the housing are joined to a portion where the at least one terminal and the circuit board are subjected to solder joining is less than a predetermined distance.

19. The electronic device according to claim 11,
wherein the cover portion and the housing are formed of polybutylene terephthalate.

20. The electronic device according to claim 11,
wherein the housing has a rectangular parallelepiped shape having an opening.

* * * * *